(12) United States Patent
Sasazawa et al.

(10) Patent No.: US 7,336,816 B2
(45) Date of Patent: Feb. 26, 2008

(54) METHOD AND APPARATUS FOR MEASURING SHAPE OF BUMPS

(75) Inventors: Hideaki Sasazawa, Yokohama (JP); Mineo Nomoto, Yokohama (JP); Masatoshi Yamaga, Atsugi (JP); Chikara Iwata, Sagamihara (JP); Masashi Uehara, Zama (JP)

(73) Assignee: Hitachi Via Mechanics, Ltd., Ebina-Shi (JP)

( * ) Notice: Subject to any disclaimer, the term of this patent is extended or adjusted under 35 U.S.C. 154(b) by 659 days.

(21) Appl. No.: 10/964,690

(22) Filed: Oct. 15, 2004

(65) Prior Publication Data

US 2005/0129304 A1 Jun. 16, 2005

(30) Foreign Application Priority Data

Oct. 17, 2003 (JP) ............................. 2003-357510

(51) Int. Cl.
*G06K 9/00* (2006.01)
(52) U.S. Cl. ...................... 382/150; 382/266; 438/613; 250/559.19
(58) Field of Classification Search ................ 382/150, 382/152, 190, 199, 266; 438/14, 64, 613, 438/614, 640, 114, 458, 959, 68, 106, 118, 438/612, 108, 113; 257/433, 737, 777, 778, 257/686, 432, 738, 774, 780, 723, E21.508, 257/E21.511, E21.705, E23.021, E23.068, 257/E23.067, E23.069, E25.013, E25.011, 257/E31.117, E31.127, E31.118; 250/216, 250/214.1, 559.34, 559.19; 29/840, 739; 348/E7.078, E5.028
See application file for complete search history.

(56) References Cited

U.S. PATENT DOCUMENTS

| | | | | |
|---|---|---|---|---|
| 4,981,372 A | * | 1/1991 | Morimoto et al. | 382/151 |
| 5,192,983 A | * | 3/1993 | Tokura | 356/608 |
| 6,133,052 A | * | 10/2000 | Ichihara | 438/7 |

(Continued)

FOREIGN PATENT DOCUMENTS

JP 11-26534 1/1999

OTHER PUBLICATIONS

"Image Inspection Supporting High-Density Mounting", T. Kubo, Toshiba Corporation, Automation vol. 46, No. 4, & English Translation thereof.

(Continued)

*Primary Examiner*—Sheela Chawan
(74) *Attorney, Agent, or Firm*—Antonelli, Terry, Stout & Kraus, LLP.

(57) ABSTRACT

The present invention provides a bump shape measuring apparatus comprising an illumination optical system which illuminates bumps arranged on a board with illumination light of a low tilt angle to a surface of the board; a detection optical system where reflected light from the bumps is condensed for detection of image signals of the bumps by a high tilt angle to the surface of the board; an image processing unit where an outline of the tip and the base of each of the bumps is calculated based on the image signals of each of the bumps, and geometric characteristics including at least a position and height of each of the bumps are calculated based on the outline of the tip and the base of each of the bumps; and a main control unit where information on the calculated geometric characteristics of the bumps is displayed on a display unit.

21 Claims, 14 Drawing Sheets

U.S. PATENT DOCUMENTS 6,144,453 A * 11/2000 Hallerman et al. ......... 356/616
6,633,663 B1 * 10/2003 Slesinger ................... 382/147
6,750,974 B2 * 6/2004 Svetkoff et al. ............ 356/602
7,075,662 B2 * 7/2006 Hallerman et al. ......... 356/604
7,171,036 B1 * 1/2007 Liu et al. ................... 382/145

OTHER PUBLICATIONS

Automation, vol. 46, No. 4, pp. 15-18, Figs. 4 and 5, Apr. 2001.

* cited by examiner 121  120

131
130

141
FREQUENCY (NUMBER OF TIMES)
DEVIATION OF HEIGHT, BOTTOM DIAMETER OR POSITION
140

133  132

150
DEFECTIVE BUMP IMAGE

AVERAGE OF HEIGHT, BOTTOM DIAMETER OR POSITION
DISPERSION OF HEIGHT, BOTTOM DIAMETER OR POSITION
BOARD UNIT OR LOT UNIT

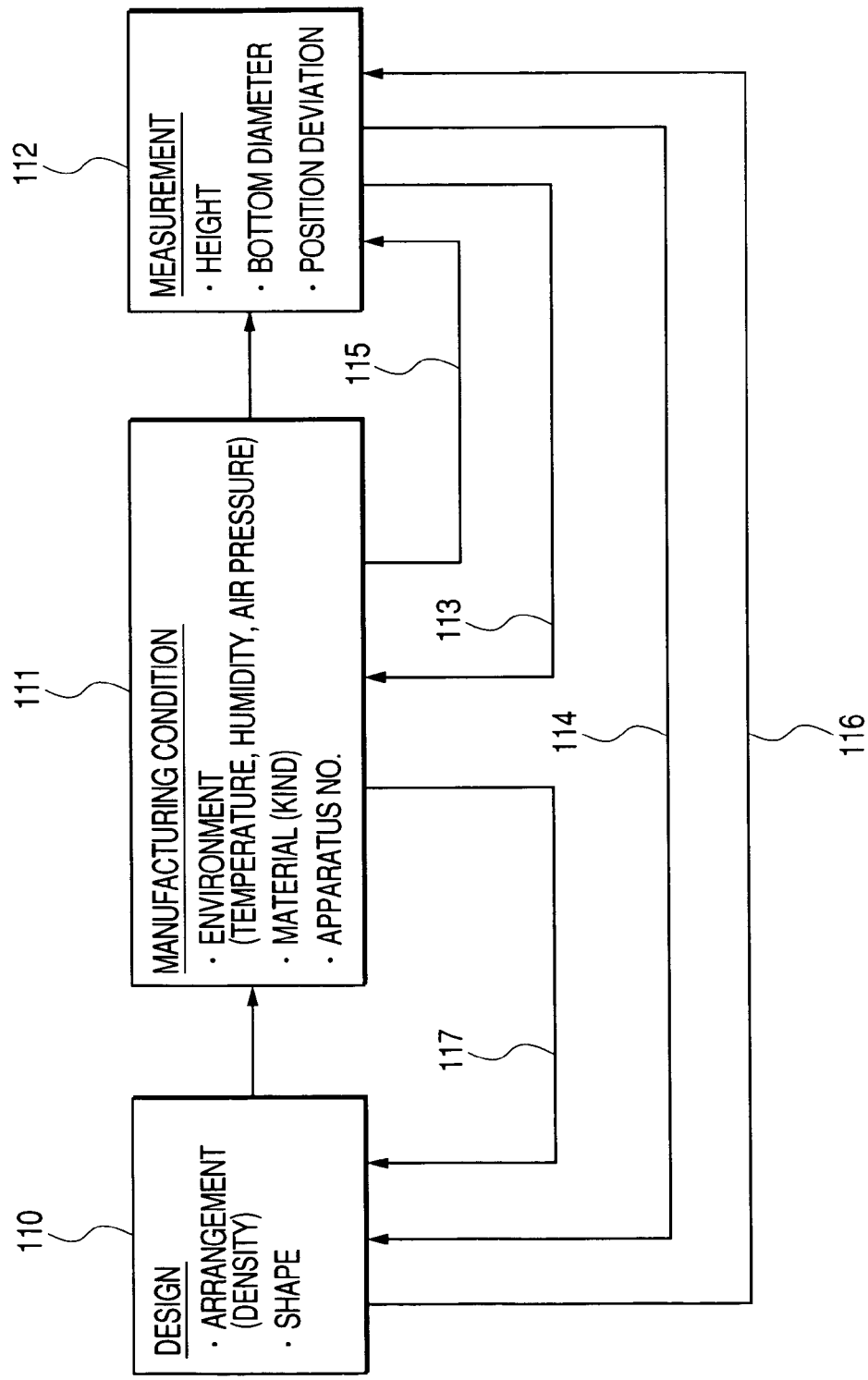

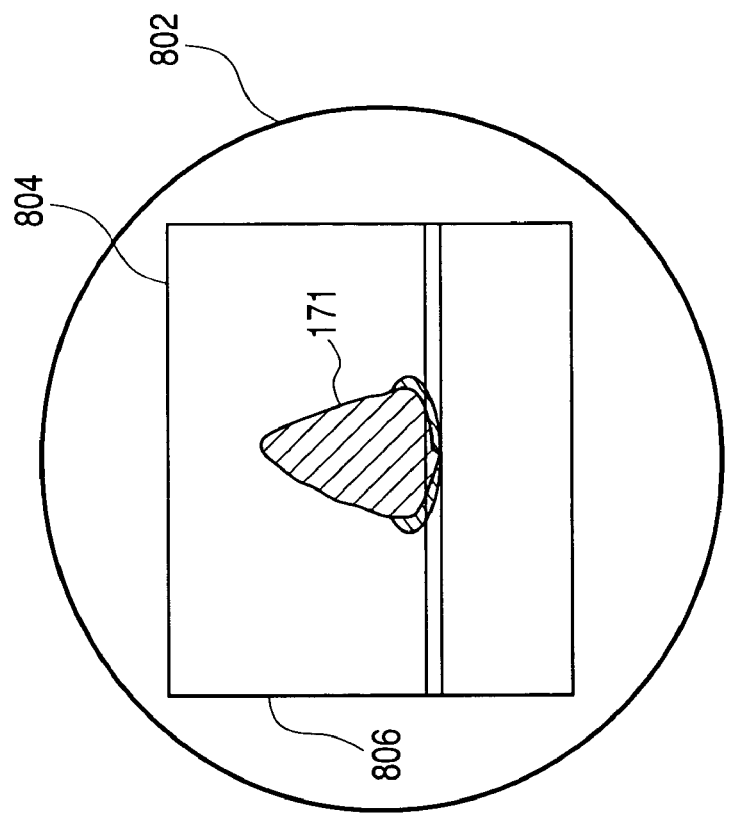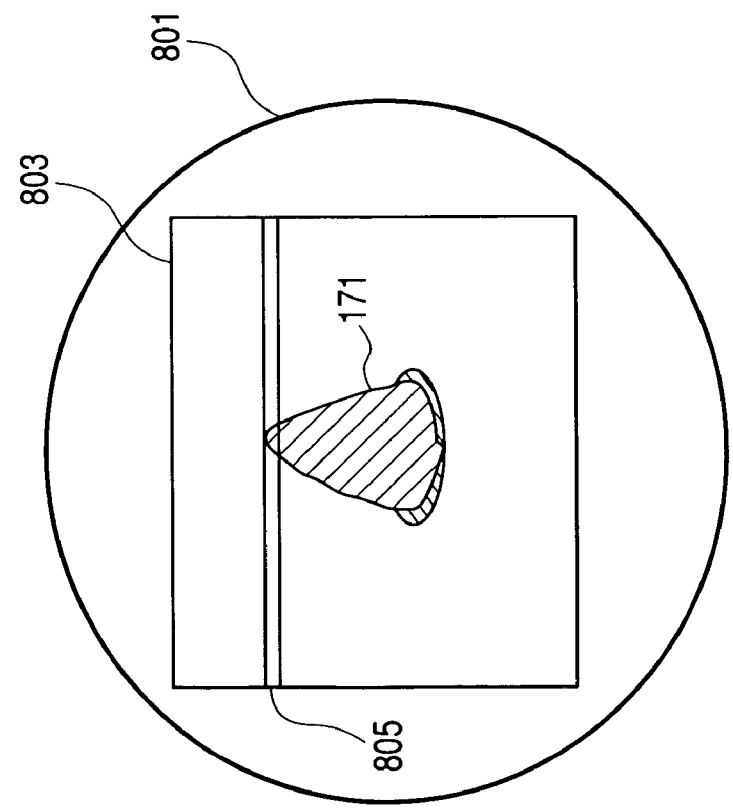

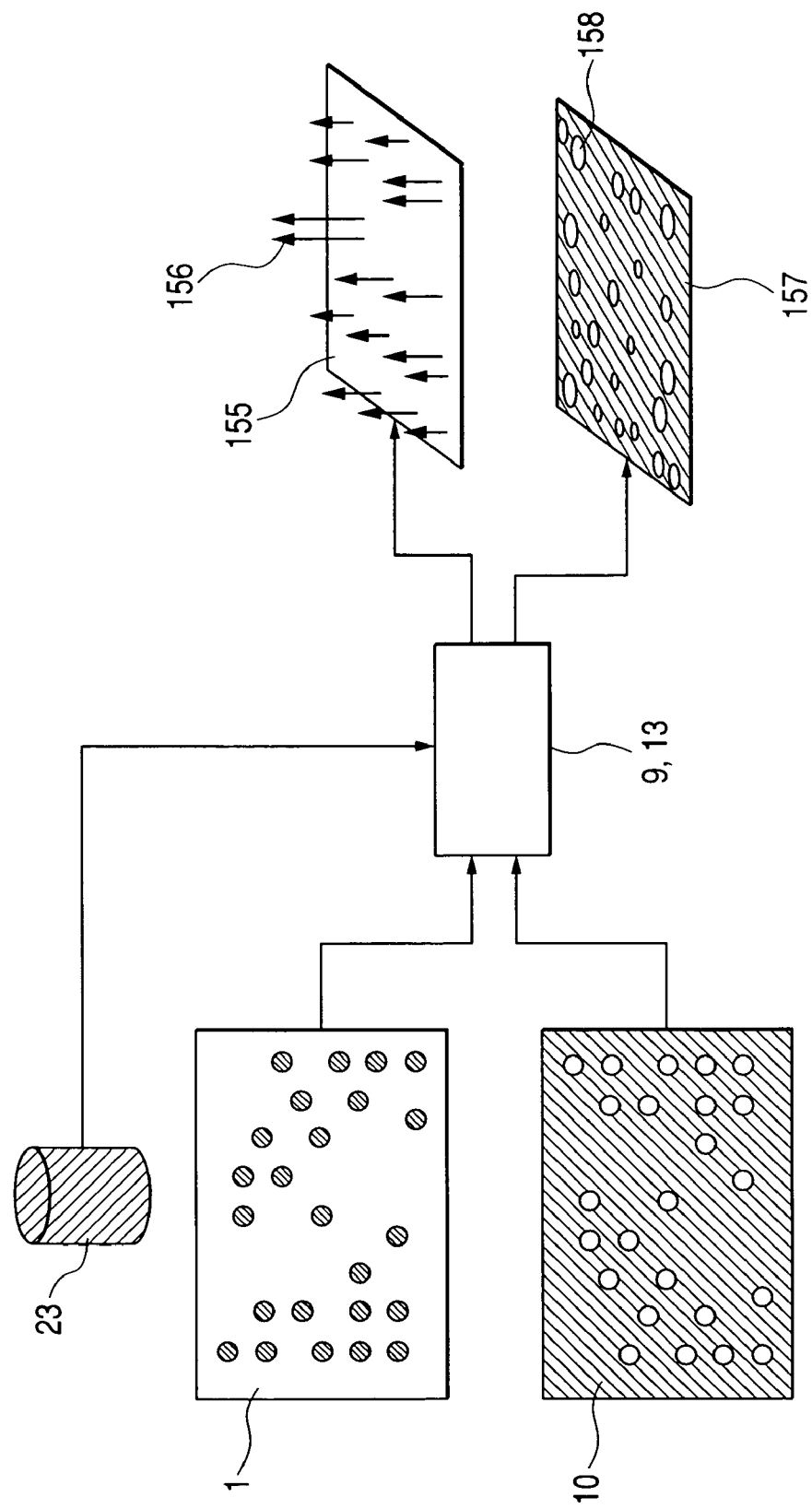

US 7,336,816 B2

METHOD AND APPARATUS FOR MEASURING SHAPE OF BUMPS

BACKGROUND OF THE INVENTION

The present invention relates to a method and apparatus for measuring a shape of bumps formed on a board (a substrate) in manufacturing a multilayer printed board or in mounting a semiconductor device on a board. The present invention further relates to a method for manufacturing the multilayer printed board, including management of the bump shape.

In recent years, a tendency to manufacture a miniaturized multilayer printed board is increasing to realize high accuracy and high density. The interlayer connection in the multilayer printed board is predominantly performed by a method where holes are provided in the connection part using a drill, a laser, or the like to realize electric conduction by plating. However, in recent years, a connection method using bumps is being applied with the tendency of high density and low cost.

On the other hand, a technology for imaging, using a camera, projection like bump electrodes formed on a semiconductor device and the like and for determining the quality of the electrodes by image processing is known in Japanese Patent Laid-open No. 11-26534, FIG. 4 and page 4 (conventional technology 1) and Automation, Vol. 46, No. 4, pages 15 to 18, FIGS. 4 and 5 (April, 2001) (conventional technology 2).

The conventional technology 1 describes the following. Specifically, illumination light composed of light beams traveling parallel to a principal surface of a circuit component or light beams having components parallel to a principal surface of the circuit component is projected onto bump electrodes. Reflected light of the illumination light to a direction perpendicular to the principal surface is incident on an imaging unit. Then, the detected image data obtained from the imaging device are compared with reference image data preliminarily stored in a storage unit to thereby determine the quality of the bump electrodes according to the level of the agreement between both the data.

The conventional technology 2 describes a method for measuring a height of bumps from images, where bumps are irradiated with illumination light from those oblique directions to allow detection of a shadow length of the bumps.

When a connection method of using bumps is employed in order to manufacture the multilayer printed board, the following steps are performed. Specifically, immediately after a step of forming bumps on the lower printed board, a bump shape measuring apparatus is used to check whether shapes such as the position, height and bottom diameter of the bumps are manufactured on the whole board according to the design. Based on the results, the lower printed board and the upper printed board are pressurized to allow conductive connection using the bumps. At this time, the possibility of causing conducting failure must be eliminated in order to secure high yields.

On the other hand, a number of products using such a multilayer printed board, e.g., a cellular phone and a digital camera, need small sized high density mounting. The cost in the printed board itself is reduced due to reduction in the cost of products. Therefore, the bump shape measuring apparatus also is required to be inexpensive and speedy. Further, the apparatus is required to have high measuring accuracy to secure high reliability for the multilayer printed board.

In the conventional technologies 1 and 2, however, adequate consideration is not given to these points.

SUMMARY OF THE INVENTION

An object of the present invention is to provide an apparatus and method for measuring a shape of bumps, in which bump parameters required to ensure a conductive connection can be measured at a high speed and with a high accuracy by simplifying the configuration of the apparatus.

Another object of the present invention is to provide a bump shape measuring apparatus, in which bump data required to control manufacturing conditions in a bump manufacturing apparatus can be presented.

Further another object of the present invention is to provide a method for manufacturing a multilayer printed board, in which by a connection method using bumps, a highly reliable multilayer printed board with no defective conductivity can be manufactured to achieve higher yield and higher throughput.

According to an aspect of the present invention, the bump shape measuring apparatus includes a stage on which a board arranged thereon with a plurality of bumps to be measured is placed and traveled (moved); an illumination optical system which illuminates the bumps arranged on the board traveled by the stage with illumination light using an illumination optical axis having a low tilt angle to a surface of the board; a detection optical system which condenses the reflected light from the bumps illuminated by the illumination optical system for detection of image signals of the bumps using a detection optical axis having a tilt angle higher than that of the illumination optical axis to the surface of the board; an image processing unit which A/D converts the image signals of the bumps detected by the detection optical system to obtain digital image signals of the bumps, calculates an outline of at least a tip and a base of each of the bumps based on the image signals of at least the tip and base of each of the bumps obtained based on the digital image signals of the bumps, and calculates geometric characteristics including at least a position and height of each of the bumps are calculated based on the outline of at least the tip and base of each of the bumps; and a main control unit which allows a display unit to display thereon information on the geometric characteristics of each of the bumps calculated by the image processing unit.

Further, according to another aspect of the present invention, the bump shape measuring apparatus includes a stage on which a board arranged thereon with a plurality of bumps to be measured is placed and traveled (moved); an illumination optical system which illuminates the bumps arranged on the board traveled by the stage with illumination light using an illumination optical axis having a low tilt angle to a surface of the board; a detection optical system which condenses the reflected light from the bumps illuminated by the illumination optical system for detection of image signals of the bumps using a detection optical axis having a tilt angle higher than that of the illumination optical axis to the surface of the board; an image processing unit which A/D converts the image signals of the bumps detected by the detection optical system to obtain digital image signals of the bumps, calculates an outline of at least a tip and a base of each of the bumps based on the image signals of at least the tip and base of each of the bumps obtained based on the digital image signals of the bumps, calculates geometric characteristics including at least a position and height of each of the bumps are calculated based on the outline of at least the tip and base of each of the bumps, and determines quality of each of the bumps based on the calculated geometric characteristics of the bumps; and a main control unit which outputs information on the quality of each of the bumps determined by the image processing unit.

Further, according to another aspect of the present invention, the manufacturing method of a multilayer printed board includes a bump manufacturing step of manufacturing bumps on a lower printed board; a bump shape measuring step of optically measuring geometric characteristics composed of at least a position and height of each of the bumps formed in the bump manufacturing step to determine the quality of each of the bumps; an interlayer insulation film forming step of projecting the tip of each of the bumps on the lower printed board having formed thereon a nondefective bump determined in the bump shape measuring step to form an interlayer insulation film on the lower printed board; and a pressurizing step of aligning and laying the upper printed board on the tip of the bumps projected from the interlayer insulation film formed in the interlayer insulation film forming step and pressurizing the upper printed board with the lower printed board to effect conductive connection by the bumps while sandwiching the interlayer insulation film between the lower printed board and the upper printed board.

According to the present invention, bump parameters required to ensure conductive connection can be measured at high speed and with high accuracy by simplifying the configuration of the apparatus.

Further, according to the present invention, a bump shape measuring apparatus can be realized in which bump data required to control manufacturing conditions in a bump manufacturing apparatus can be presented.

Further, according to the present invention, a measured height distribution or position deviation of bumps is sequentially fed back to a manufacturing apparatus of bumps, so that by a connection method using bumps, a highly reliable multilayer printed board with no conductive defect can be manufactured to achieve higher yield and higher throughput.

These and other objects, features and advantages of the invention will be apparent from the following more particular description of preferred embodiments of the invention, as illustrated in the accompanying drawings.

BRIEF DESCRIPTION OF THE DRAWINGS

FIG. 4(a) is a diagram showing a distribution in geometric characteristics of bumps in color, shading, shape, and the like;

FIG. 5 is a diagram for explaining a bump shape measuring apparatus according to the present invention applied to a bump manufacturing apparatus and a CAD system;

FIG. 11(a) is a diagram showing a state in which a first linear image sensor takes an image focusing on a tip of a bump in the detection optical system shown in FIG. 10;

FIG. 11(b) is a diagram showing a state in which a second linear image sensor takes an image focusing on the base of the bump in the detection optical system shown in FIG. 10;

FIG. 15 is a diagram for explaining bump shape measurement and hole shape measurement performed by the bump shape measuring apparatus shown in FIG. 14.

DESCRIPTION OF THE PREFERRED EMBODIMENTS

Preferred embodiments according to the present invention will be described with reference to the drawings.

In recent years, a tendency to manufacture a miniaturized multilayer printed board is increasing to realize high accuracy and high density. In particular, in a field of printed boards for notebook computers, PDAs and cellular telephones, a tendency to realize a high density and miniaturization in wiring on a board and in connection between board layers is also increasing with high mounting density of components.

Figure 1:
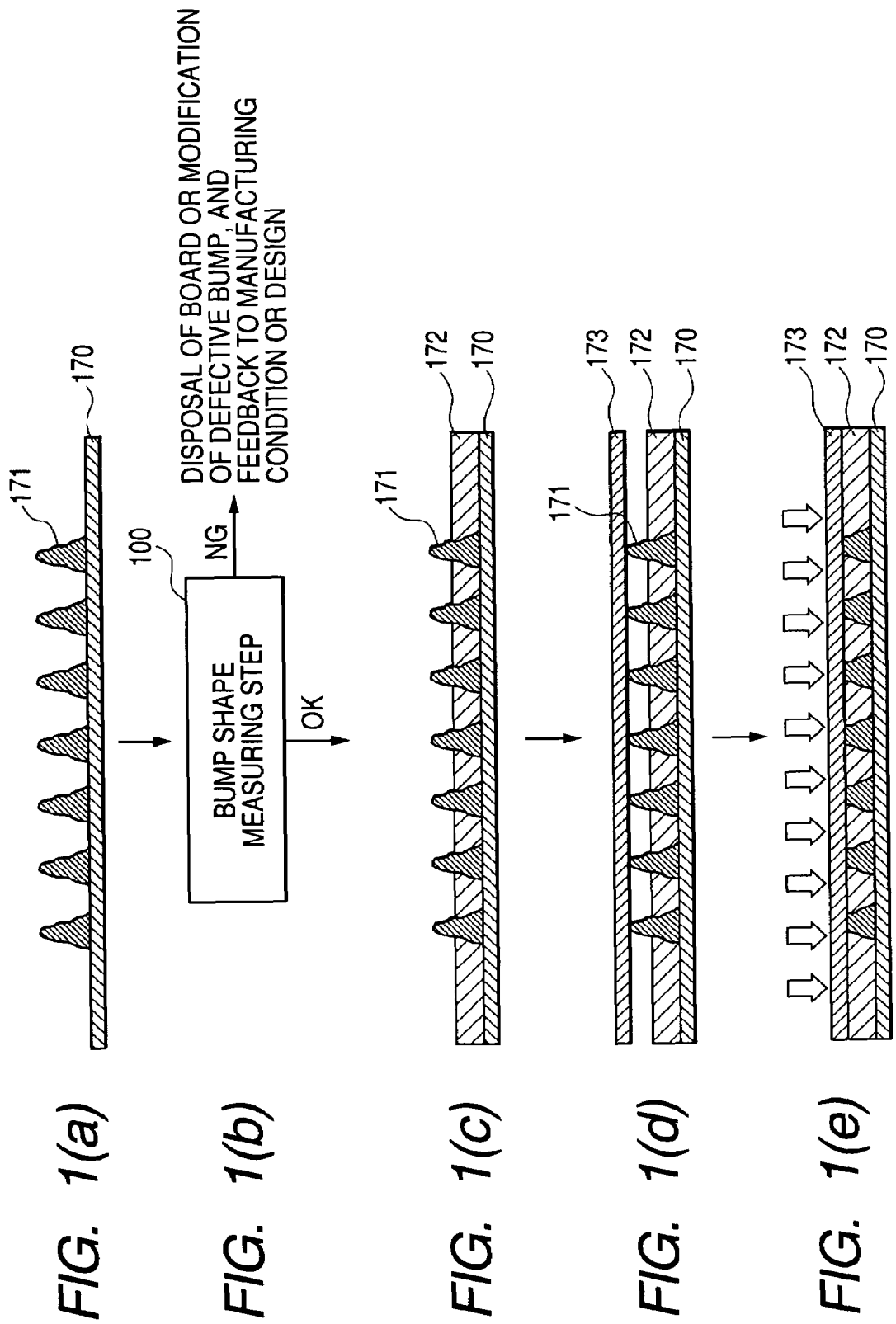
FIGS. 1(a) to 1(e) are views for explaining one embodiment of a manufacturing process of a multilayer printed board using a method of connecting bumps according to the present invention.

Accordingly, with such a tendency toward higher density and lower costs, a connection method using bumps as shown in FIG. 1 is being applied. As shown in FIG. 1(a), a pseudo cone-shaped bump 171 made of silver, copper, etc. and having a height of about 200 μm is formed at a point which is located on a lower printed board 170 formed with wiring thereon and which is connected to an upper printed board through the bump 171. Of course, on the lower printed board 170, a pad connected to the wiring is formed in a position where the bump 171 is formed. This bump 171 is formed by a method where paste prepared by dissolving silver or copper particles with a solvent is printed using screen printing, etc. and then dried. Otherwise, the bump 171 can also be formed by a method where paste made of silver or copper is coated on the lower printed board 170, dried and then etched using a photo-process.

In this stage, in order that conductive connection between the lower printed board 170 and the upper printed board 173 can be surely conducted by the bump 171, and the adjacent bumps are not short-circuited, that is, the possibility of causing defective conductivity is eliminated, at least a height, a diameter of the base and a position in X and Y directions of the pseudo cone-shaped bump 171 must be within the desired range. Accordingly, in a bump shape measuring step 100 shown in FIG. 1(b), measurement is performed using the bump shape measuring apparatus according to the present invention to check whether at least the height, diameter in the base and position in X and Y directions of the bump is produced according to the design over the whole surface of the board. The lower printed board 170 as an acceptable board in which all the bumps are nondefective is transferred to the next step. On the other hand, the lower printed board 170 as an unacceptable board having a defective bump is discarded or the defective bump is modified and fed back to the manufacturing conditions such as screen printing or to the design. As a result, the bumps subsequently manufactured will be reformed to nondefective ones.

In the next step, on the lower printed board 170 formed with the nondefective bumps 171, an interlayer insulation film 172 such as a polyimide film is coated or laid in a sheet-form, as shown in FIG. 1(c). When the sheet-formed interlayer insulation film 172 is laid, holes are made in the film by the application of pressure to obtain a printed board where tips of the bumps are slightly projected from the interlayer insulation film 172. On this occasion, a thickness of the interlayer insulation film 172 is determined such that the tips of the bumps are slightly projected from the interlayer insulation film 172. When the interlayer insulation film 172 is coated, the resin film adhered onto the tips of the bumps must be removed by etching.

Next, as shown in FIG. 1(d), the upper printed board 173 having formed with thereon wiring and pads for connecting the bumps 171 is placed on the tips of the bumps which are positioned (aligned) between the upper and lower printed boards in X and Y directions.

As shown in FIG. 1(e), when the upper printed board 173 is pressurized together with the lower printed board 170, the bumps are compressed to realize the conductive connection between the upper printed board 173 and the lower printed board 170. Thus, the conductive connection between the lower printed board 170 and the upper printed board 173 is enabled by the nondefective bumps embedded in the interlayer insulation film 172.

Next, repeating the steps shown in FIGS. 1(a) to 1(e) enables the miniaturized multilayer printed board to be produced with high yields.

In such a connection method using bumps, miniaturization and reduction in cost can be expected as compared with the conventional connection method using hole drilling and plating.

Next, a first embodiment of the bump shape measuring apparatus according to the present invention for use in the bump shape measuring step 100 is described.

Figure 2:
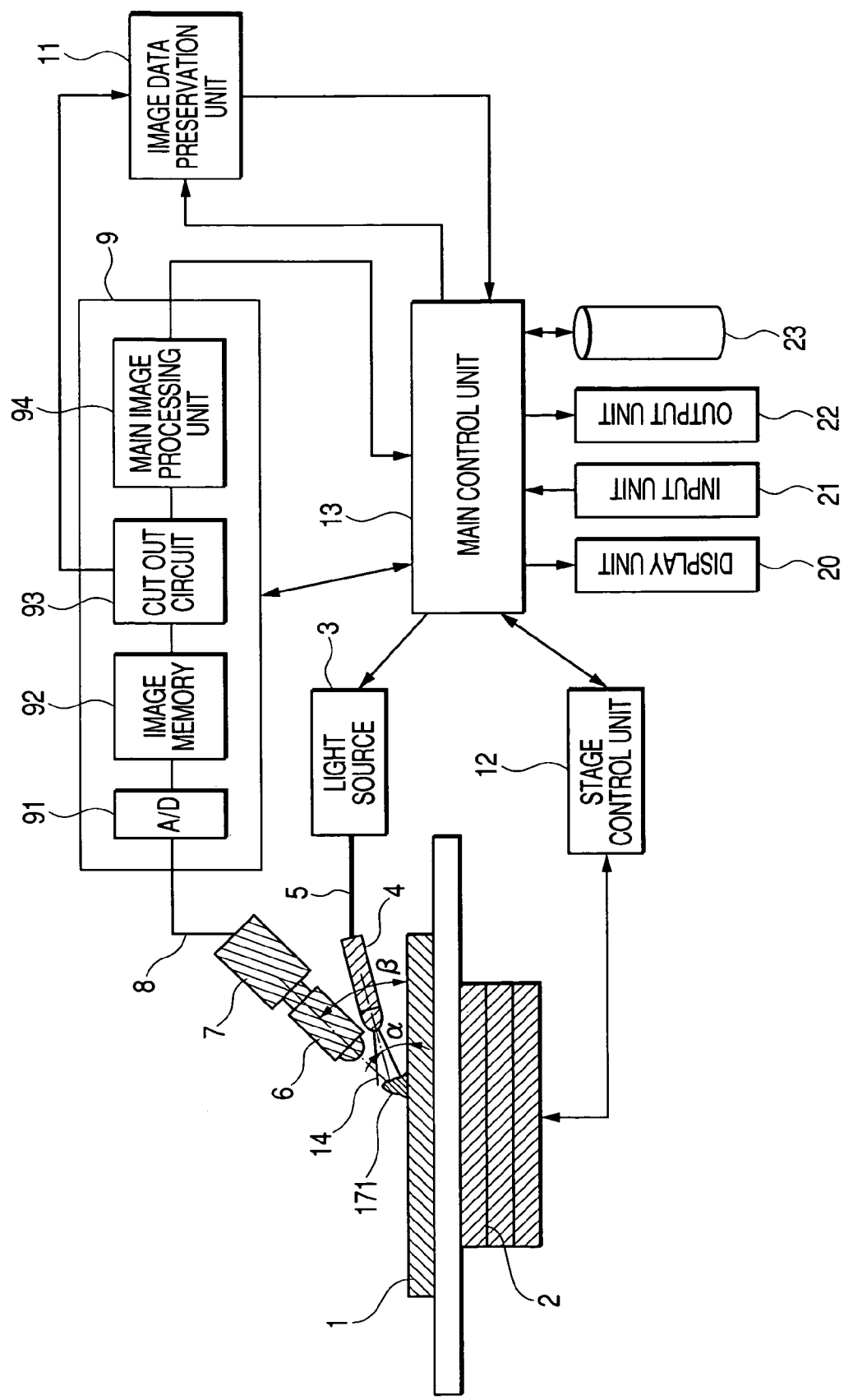
FIG. 2 is a configuration diagram showing a first embodiment of a bump shape measuring apparatus according to the present invention.

FIG. 2 is a configuration diagram showing a first embodiment of the bump shape measuring apparatus according to the present invention.

A printed board (board) 1 formed with thereon a plurality of bumps 171 to be measured is absorbed and mounted to a stage 2 movable to three directions of X, Y and Z. The reason why the stage 2 absorbs and holds the printed board 1 as described above is to eliminate the warpage of the printed board 1. Thus, the warpage is eliminated. In addition, the height of the bumps 171 is about 200 μm therefore, an automatic focusing control system of a condenser lens 6 for a surface of the printed board 1 need not be provided. Of course, when the automatic focusing control system is provided, the same bump image can be formed on an image detection camera 7 using the condenser lens 6 even if a thickness of the printed board 1 varies. Further, white light emitted from a light source 3 such as a halogen lamp is directed to an illumination lens system 4 through an optical fiber 5. An illumination optical system includes the light source 3, the optical fiber 5 and the illumination lens system 4.

When a wiring pattern made of copper, etc. is formed on the printed board 1 and a silver bump is used as the bump 171, a short wavelength of 570 nm (green) or less may be preferably used as a wavelength of the illumination light. By doing so, an image having a contrast higher than that of a background can be obtained from the bump 171. Of course, the white light containing a number of the wavelength components as described above may also be used. In short, when white light or light having a wavelength of 570 nm or less is used as the illumination light, the bump can be allowed to appear through the background. The illumination lens system 4 is composed, for example, of a cylindrical lens, wherein only light in the direction perpendicular to the printed board 1 is condensed into a fine strip-like luminous flux (a slit-like luminous flux) 231, as shown in an enlarged diagram 220 of FIG. 3. The illumination lens system 4 emits illumination light 14 to the printed board 1 at an angle a of as low as about 30° or less. Incidentally, when the illumination angle (an angle of the illumination optical axis to which illumination principal light travels) α is set to an extremely low angle, adjacent bumps interact with one another because the bumps 171 are densely arranged on the printed board 1. Therefore, the illumination light 14 is emitted at the angle α of as low as about 30° or less as described above. By doing so, most of reflection in the surface of the printed board 1 including pads becomes regular reflection and therefore, the reflected light is not directed to the condenser lens 6. As a result, the printed board 1 including pads is detected darkly as a background. On the other hand, most of scattered light in the surface of the bumps 171 is nearly regular reflection and therefore, is directed to the condenser lens 6. As a result, the bumps 171 are detected brightly. Thus, intensity of reflected and scattered light from the surface of the bumps 171 is increased. Therefore, contrast with the printed board 1 as a background is elevated, and as a result, only the bumps 171 can be allowed to appear.

When most of the reflected and scattered light from the surface of the bumps 171 illuminated by the illumination light 14 is directed into the condenser lens 6, a bright image of the bump 171 appearing through the dark background is taken by an image detection camera 7 comprising, for example, a CCD linear sensor. In order to take an image containing more information about the height of the bump 171, the image detection camera 7 is inclined at the detection optical axis angle β to the bump 171. The camera 7 detects the image of the bump 171 at an angle, for example, of β=about 30° to 50°. The optical axis of the condenser lens 6 corresponds to the detection optical axis. The image detection camera 7 is, for example, a CCD linear sensor. It detects an image signal in an image detection area 201 through a stage control unit 12 and a main control unit 13, as described in the enlarged view 220 of FIG. 3, with the image pickup region (image pickup view) 241 of the CCD linear sensor being continuously moved in synchronization with the scanning of the stage 2 indicated by an arrow. At this time, X Y Z displacement measured by a displacement gauge provided on the XYZ stage 2 is inputted into the stage control unit 12, whereby the amount of displacement of the XYZ stage is given to the main control unit 13. Thereafter, the image signal 8 detected by the image detection camera 7 is transmitted to an image processing unit 9.

The image processing unit 9 includes an A/D conversion unit 91, an image memory 92, a cut-out circuit 93 and a main image processing unit 94. The A/D conversion unit 91 A/D converts the detected image signal 8. The image memory 92 stores therein the gray value (gradation value) image signal F(x,y) 202 subjected to the A/D-conversion. The cut out circuit 93 cuts out the gray value image signals [P1(i, j) to Pn(i, j)] (images only in the region containing the bumps, which are selected from the detection images) 204 for each bump from the gray value image signal F(x, y) 202 stored in the image memory 92, based on the array design data of the bumps. In the main image processing unit 94, geometric shape data such as a height, bottom (base) diameter and central position of the bump are calculated based on the gray value image signals [P1(i, j) to Pn(i, j)] 204 cut out for each bump by the cut-out circuit 93. The calculated geometric shape data of the bump are compared with the criterion to perform the determination of the bump quality. Then, the calculated geometric shape data of the bump or the determination results of the bump quality are outputted to the main control unit 13.

The image data preservation unit (the image data storage unit) 11 stores for a long time of period the gray value image signal Pk(i, j) about at least a defective bump, which is obtained from the main control unit 13, after having been cut out from the image memory 92 by the cut out circuit 93. Thus, the main control unit 13 allows the display unit 20 to redisplay the gray value image signal Pk(i, j) about the defective bump thereon in response to the requirement of users. Further, the main control unit 13 can provide the bump manufacturing apparatus 111 with the gray value image signal Pk(i, j) about at least the defective bump, which is stored in the image data storage unit 11.

Figure 4A:
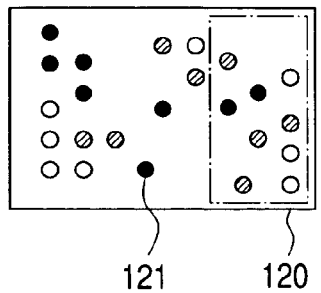

The cut-out circuit 93 does not necessarily cut out all the bumps formed on the printed board but has only to cut out a typical bump. The typical bump is obtained, for example, by specifying it using the past measurement results displayed on the screen of the display unit 20 as shown in FIG. 4(a). Alternatively, the typical bump can also be specified as a measurement recipe depending on the manufacturing conditions.

The display unit 20 displays various measurement results, measurement recipes, measurement conditions, or the like.

An input unit 21 inputs a selection command of the display or output mode for displaying or outputting the data on an object to be measured, such as the measurement recipes (as shown in FIG. 5, the recipes include design data obtained from a CAD system 110 such as design data 116 on the printed board 1, which contain types of the printed board 1, and design data 116 on arrangement on the printed board 1 (e.g., a printing pattern for screen-printing corresponds thereto), which contain types of bumps; and bump manufacturing conditions 115 obtained from the bump manufacturing apparatus 111); measurement conditions (e.g., criteria for determining the quality of bumps or conditions for specifying nondefective bumps and defective bumps); and measurement results.

An output unit 22 includes also a network for the feedback to the bump manufacturing apparatus 111 or CAD system 110 shown in FIG. 5.

Figure 3:
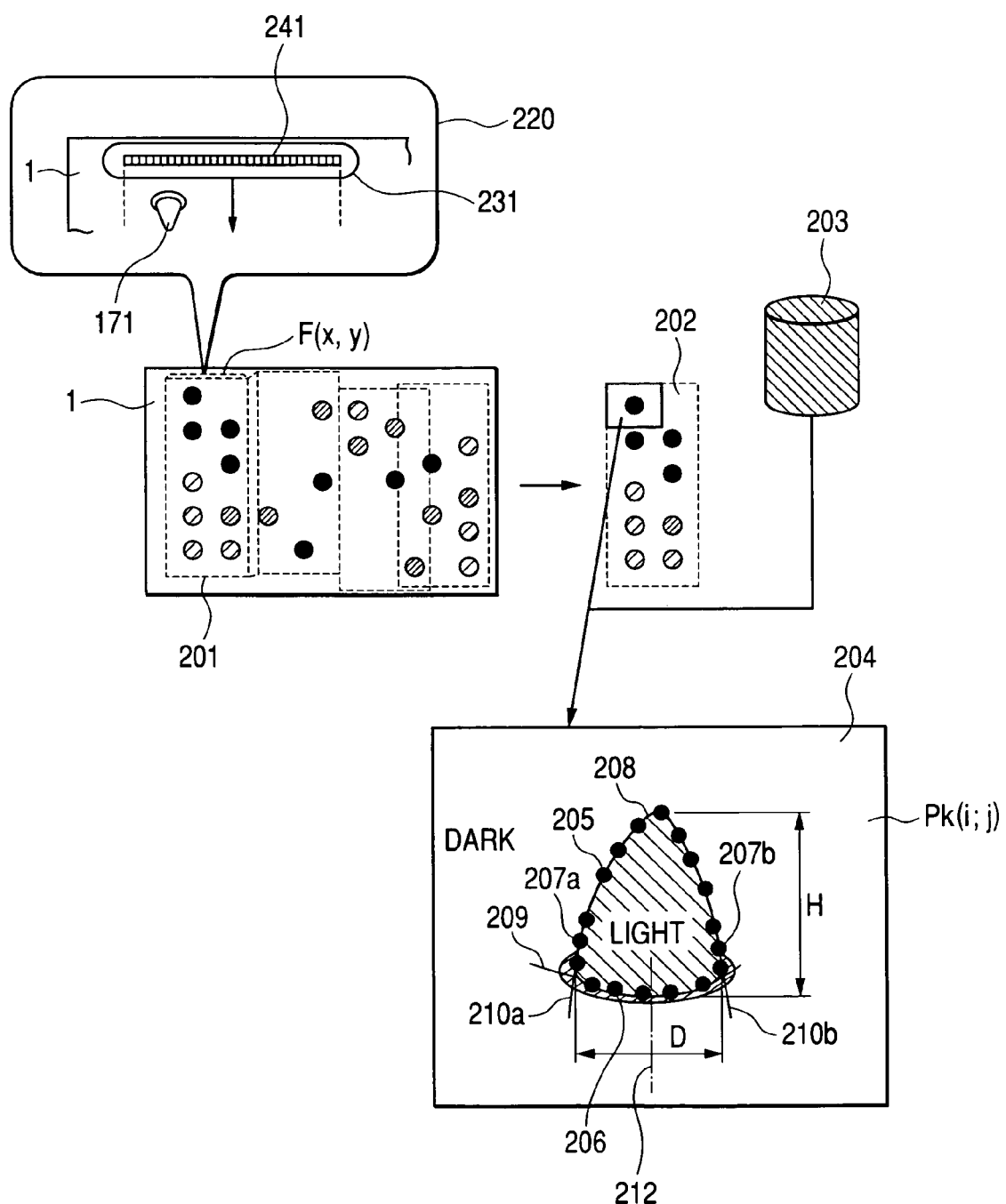
FIG. 3 is a diagram for explaining an image signal detected by a detection optical system and image processing in an image processing unit shown in FIG. 2.

A process flow of the bump shape measurement according to the present invention is to be described with reference to FIG. 3. Firstly, the main control unit 13 sets the image detection area 201 so as to effectively detect an area where the bumps 171 to be measured are arranged based on the bump arrangement data of the printed board inputted using the input unit 21. By controlling the stage control unit 12 based on the commands from the main control unit 13, the stage 2 absorbing and holding the printed board 1 moves in the X and Y directions as below. The image pickup region 241 in the linear sensor of the image detection camera 7 scans the image detection area 201 to take an image in a specified order. At the same time, the illumination lens system 4 condenses white light or light having a wavelength of 570 nm or less into a slit-like luminous flux 231 to irradiate the image pickup region 241 at an angle α of as low as about 30° or less from the moving direction. As a result, an image signal is obtained from the image detection camera 7 in synchronization with the scanning of the stage. The image signal obtained is converted into a digital image signal by the A/D conversion unit 91, and the resulting digital image signal as the image signal 202 is stored in the image memory 92.

Next, from the image signal 202 stored in the image memory 92, the cut out circuit 93 extracts (cuts out) image data Pk (i, j) 204 on only one bump by referring to bump position CAD data (bump arrangement data) 203 obtained from the main control unit 13. The reason why the cut out circuit 93 extracts (cuts out) the image data Pk(i,j) 204 on only one bump is to facilitate the image processing in the main image processing unit 94. The cut out circuit 93 is not necessarily required as long as the bottom position, height and bottom diameter for each bump can be determined.

Next, the main image processing unit 94 applies an image processing algorithm to the extracted image data Pk(i,j) 204 on only one bump. The image detection camera 7 takes an image at a tilt angle β of about 45° in the moving direction. Accordingly, the image data Pk(i,j) 204 comprising a bright section indicating the bump and a dark section indicating the background (pads and a surface of the printed board 1), can be obtained from one bump. Therefore, when the image data Pk(i, j) are binarized by a specified threshold, the edge (outline) coordinate data of the bump is obtained. Further, when the image data Pk(i, j) are differentiated for the determination of the peak coordinates, the edge (outline) coordinate data of the bump can be obtained.

Next, in the image data, for example, a quadratic approximating curve or an elliptic approximating curve 208 is calculated from a set (an outline) 205 of respective edge points at the tip of the bump, and quadratic approximating curves or elliptic approximating curves 209, 210a and 210b are calculated from sets (outlines) 206, 207a and 207b of respective edge points at the bottom of the bump base and at the edge of the bump base, respectively. By doing so, a two-dimensional geometric shape obtained by viewing the bump at a tilt angle β of about 30° to 50° can be stably detected. When a distance between the highest point of the curve 208 and the lowest point of the curve 209 is calculated, a height H of the bump in the image data can be determined. When a distance between an intersection point of the curve 209 and the curve 210a, and an intersection point of the curve 209 and the curve 210b is calculated, a bottom diameter (a diameter of the base) D of the bump in the image data can be determined. When middle point coordinates between the intersection coordinates of the curve 209 and the curve 210a, and the intersection coordinates of the curve 209 and the curve 210b are determined, bump position coordinates as a center position 212 of the bump base can be calculated.

When it is desired to determine the actual height and bottom diameter of the bump, a correction coefficient by a component of the detection angle β may be multiplied. The correction coefficient can be determined as follows: Using the typical bump, the coefficient can be calculated based on the results of the actual measurement obtained by use of a measuring tool, and the results of the measurement obtained from the image data such as the height H and bottom diameter D of the bump.

As described above, the height H, bottom diameter D and position 212 of the bump, which are minimally required as measurement results of the bump shape measuring apparatus because the bump 171 has a shape of pseudo cone, can be obtained. As a result, it can be confirmed that conductive connection between the lower printed board 170 and the upper printed board 173 can be surely conducted by the bump 171 and adjacent bumps are not short-circuited. When the height H, bottom diameter (diameter of the base) D and bottom (base) position 212 of the bump are obtained, the quality of the bump having no defective conductivity can be determined. The height H and bottom (base) position 212 of the bump are required to ensure conductive connection with the pad on the upper printed board 173. The bottom diameter D and bottom (base) position 212 of the bump are required to ensure conductive connection with the pad on the lower printed board 170.

In addition, the geometric shape of the bump conceivably includes the shape of the tip (pseudo cone angle) and the volume. The shape of the tip (pseudo cone angle) can be determined from the calculated quadratic approximating curve or elliptic approximating curve 208. The volume can be determined based on the bottom diameter, height and tip shape (pseudo cone angle) of the bump. However, when the bump 171 is formed by the screen printing, the quality of the bump is usually determined sufficiently by information on the height of the bump. This is because the height and tip shape (pseudo cone angle) of the bump apparently have a correlation with each other.

The style of output to the display unit 20 or the output unit 22 of the bump shape measurement results performed by the main control unit 13 is described. FIG. 4(a) is a diagram showing measurement result data obtained from the main control unit 13. The data are displayed on a screen of the display unit 20 as a distribution 120 of the height, the bottom diameter, the bottom position, and the like which are geometric characteristics of each bump on the printed board. The distribution 120 is obtained by varying the color or shading or shape of each bump 121 in accordance with the amount of displacement from the design value. In addition, the main control unit 13 can classify the bumps by defective category (the height, the bottom diameter and the bottom position) and display the defective bumps on the screen of the display unit 20. By doing so, causes for defect are easily found.

Figure 4B:
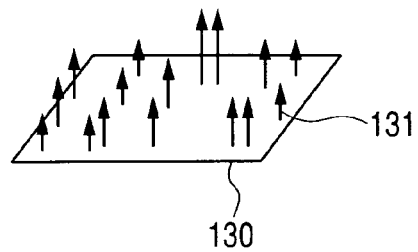
FIG. 4(b) is a diagram showing a distribution in geometric characteristics of bumps in a three-dimensional vector.

FIG. 4(b) is a diagram showing measurement result data obtained from the main control unit 13. The data are displayed on the display unit 20 by a three-dimensional vector 131 as a distribution 130 of the height, the bottom diameter, the bottom position, and the like which are geometric characteristics of each bump on the printed board. When the measurement results are shown using a state of the distribution on the printed board, the state at the bump manufacturing step shown in FIG. 1(a) can be easily grasped.

As described above, FIGS. 4(a) and 4(b) are views showing the information on the geometric characteristics (the height, bottom diameter and bottom position) of the bump. The information is shown as distributions 120 and 130 of the geometric characteristics of the bump in the printed board.

Figure 4C:
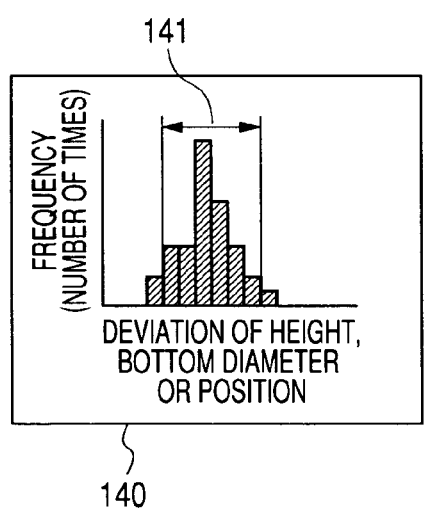
FIG. 4(c) is a histogram graphically showing a frequency (number) of bumps relative to geometric characteristics.

FIG. 4(c) is a graph showing measurement result data obtained from the main control unit 13. The data are displayed on the display unit 20 as a histogram 140 where in the whole printed board or at every specified region, the amount of displacement from the design values of the height, bottom diameter and position of the bump is set on the horizontal axis and the frequency (number) is set on the vertical axis. When the histogram 140 is displayed as described above, the number and its distribution within the criterion (the design tolerance) 141 for determining the quality can be grasped in the whole printed board or at every specified region. Accordingly, for example, readjustment of the criterion (the design tolerance) as a measurement recipe can be performed. When the histogram is displayed, the distribution in the displacement of the bump or its three-dimensional vector shown, respectively, in FIGS. 4(a) and 4(b) may be displayed with the histogram display. By doing so, the cause of increasing the deviation can be found by the height, bottom diameter or position of the bump.

As described above, FIG. 4(c) is a diagram displaying the information on the geometric characteristics (the height, the bottom diameter and the bottom position) of the bump. The information is displayed as a frequency of occurrence 140 in the geometric characteristics of the bump in the printed board.

When the respective screen images shown in FIGS. 4(a), 4(b) and 4(c) described above are displayed for each bump manufacturing apparatus (e.g., screen printer), the difference between the bump manufacturing apparatuses can be grasped.

Figure 4D:
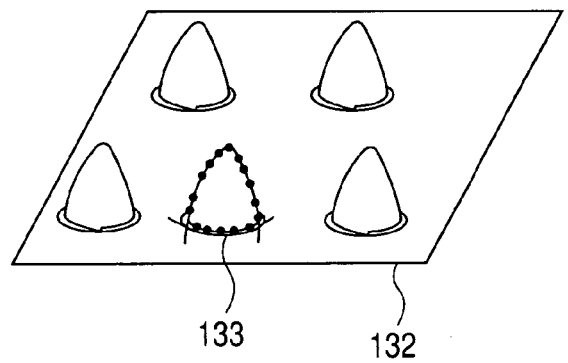
FIG. 4(d) is a diagram showing a detected image signal of bumps, in which an additional line is drawn.

FIG. 4(d) is a diagram displaying on the display unit 20 an image of the actual bump stored in the image data storage part 11 and an image of the bump having an edge (an outline) where an additional line calculated in the main image processing unit 94 is drawn. Using the input unit 21, the images in a certain area is specified, for example, in a state where the screen image shown in FIG. 4(a) is displayed on the display unit 20. As described above, since the image of the bump having an edge where an additional line is drawn is displayed, the actual state of the bump can be observed. However, the detected image of the bump has higher contrast with respect to the background. Therefore, the additional line is not necessarily shown.

Figure 4E:
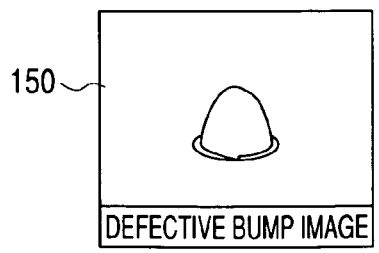
FIG. 4(e) is a diagram showing a detected image of a defective bump.

FIG. 4(e) is a diagram displaying on the display unit 20 an image 150 of a defective bump which is selected from the images stored in the main control unit 13. Using the input unit 21, the image 150 of the defective bump is specified by the main control unit 12, for example, in a state where a screen image of the defective bumps is displayed on the display unit 20 as shown in FIG. 4A. Thereafter, the main image control unit 13 selects the image 150 of the defective bump specified above from the images stored in the image data storage unit 11. When the image of the defective bump is displayed as described above, it can be checked whether measurement recipes such as quality determination is correctly performed.

Figure 4F:
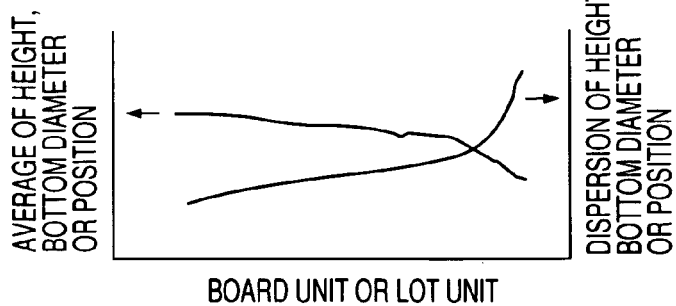
FIG. 4(f) is a diagram showing variation with time in geometric characteristics of bumps.

FIG. 4(f) is a graph displaying on the display unit 20 variation with time in bump shape measurement results. In the main control unit 13, the variation with time in the bump shape measurement results stored in the storage device 23 is calculated by the printed board or by the lot. More specifically, FIG. 4(f) is a diagram showing the information on the geometric characteristics (the height, the bottom diameter and the bottom position) of the bump. The information is shown as the variation with time in the geometric characteristics of the bump. The bump shape measurement results where the variation with time is calculated conceivably includes an average and a dispersion of the height, bottom diameter or bottom position of the bump. When the variation with time in the shape of the bump is outputted as described above, the following advantages can be obtained. For example, the user can grasp such a state that when the bump is formed by the screen printing, clogging occurs and the variation with time is gradually increased to approximate the criterion (design tolerance). Therefore, the user can previously issue an alarm to take measures in advance before a number of defective bumps are generated. Further, when the variation with time is fed back to the bump manufacturing steps and compared with the variation of the bump manufacturing condition, the user can find the manufacturing conditions where defective bumps are generated.

The bump shape measuring apparatus 112 shown in FIG. 5, which has a configuration described above, can monitor a state of the bump manufacturing process. More specifically, when the main control unit 13 of the bump shape measuring apparatus 112 determines that the bump shape measurement results such as the height and bottom diameter of the bump in a specified region on the printed board 1 are shorter than the design tolerance (criterion), the unit 13 outputs such alarm information that the amount of bump materials supplied to the region is short. Then, the output results 113 are provided to the bump manufacturing apparatus 111 through the output unit 22 such as a network. As a result, the bump manufacturing apparatus 111 can issue an alarm. Thus, the main control unit 13 of the bump shape measuring apparatus 112 performs feedback 113 of the measurement results stored in the storage unit 23 or in the image data storage unit 11 to the manufacturing conditions (environment (temperature, humidity, air pressure), material (kind, concentration of solvent) and apparatus No.) in the bump manufacturing apparatus (e.g., screen printer) 111. By doing so, the manufacturing conditions are controlled in the bump manufacturing apparatus 111, so that bumps can be stably manufactured.

When the conditions are not improved despite the feedback to the bump manufacturing apparatus 111, the bump shape measuring apparatus 112 provides the bump shape measurement results 114 to the CAD system 110. By doing so, the CAD system can support the change in design conditions such as stable arrangement (density) of the bumps. In this case, the bump shape measuring apparatus 112 grasps the number and its distribution within the design tolerance (criterion) 141 using the histogram of measuring object items as shown in FIG. 4(c). By doing so, setting of the design tolerance is easily readjusted. When the occurrence of defective bumps is not suppressed despite the controlling of the bump manufacturing condition, the bump manufacturing apparatus 111 finds out the design conditions 117 where defective bumps are not caused, based on the bump manufacturing conditions. Then, the apparatus 111 feeds the design conditions 117 back to the CAD system 110 to change the design.

Figure 6:
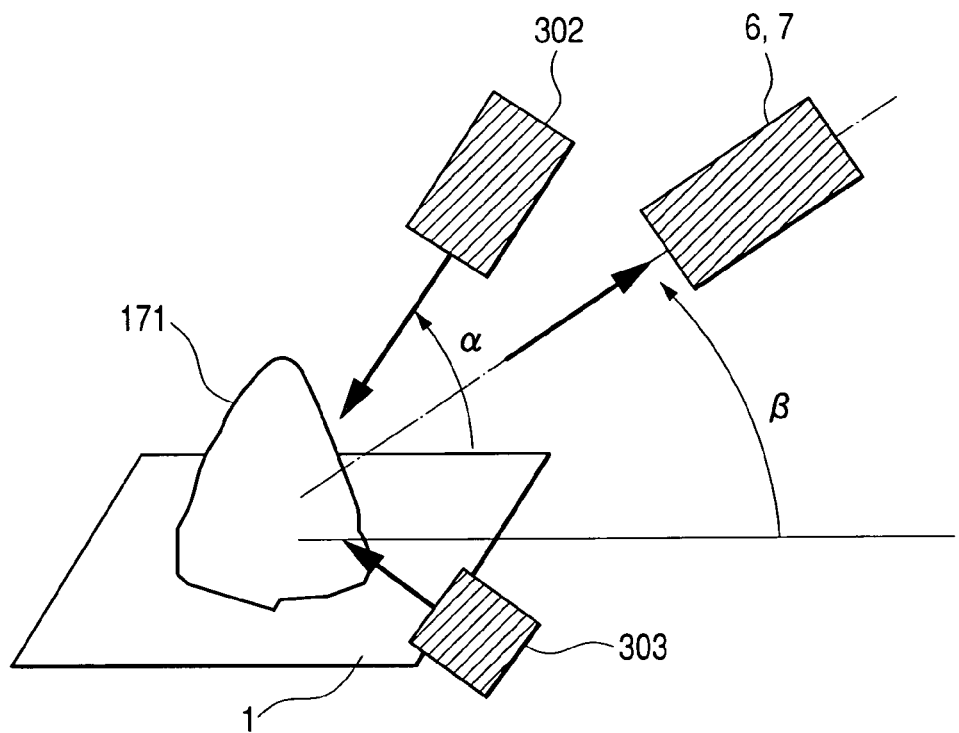
FIG. 6 is a schematic perspective view showing an illumination optical system of a second embodiment different from that of the first embodiment shown in FIG. 2.
Figure 7:
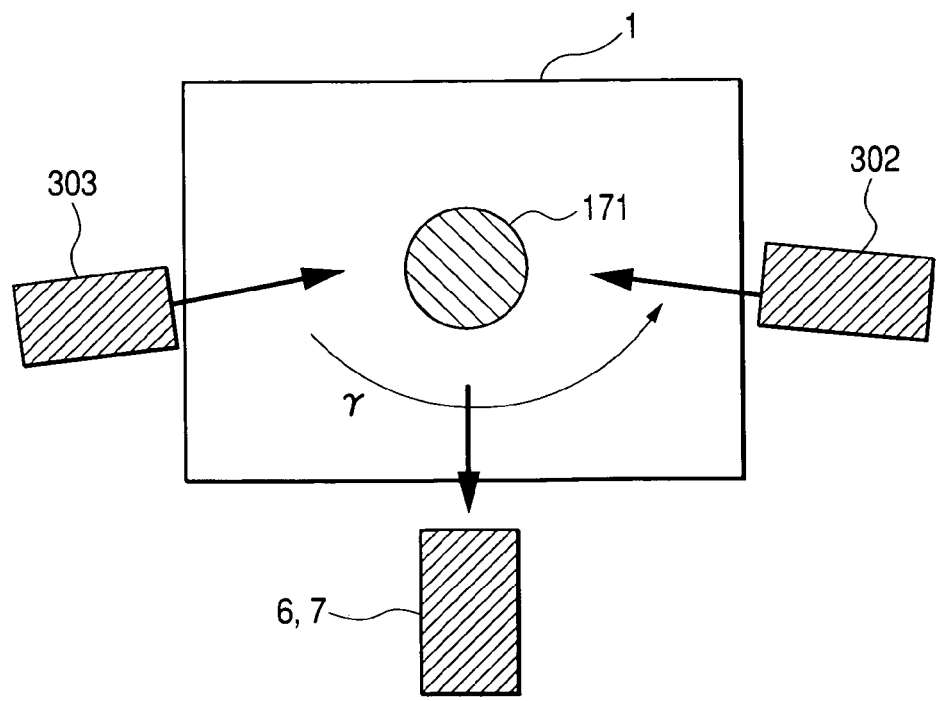
FIG. 7 is a schematic plan view of the illumination optical system according to the second embodiment shown in FIG. 6.

A second embodiment of the illumination optical system in the bump shape measuring apparatus according to the present invention is described with reference to FIGS. 6 and 7. The second embodiment differs from the first embodiment shown in FIG. 2 in the following point. That is, two illumination optical systems (illumination devices) 302 and 303 are provided which illuminate the bump 171 to be measured on the printed board 1 from a plurality of directions such as at least two directions. Each of the elevation angles α of the two illumination optical systems 302 and 303 is lower than an angle β of the detection lens (condenser lens) 6, e.g., about 10°. An angle γ formed between both the illumination optical systems is narrower than 180°, e.g., about 150°. It is apparent that three or more illumination optical systems may be provided.

Figure 8:
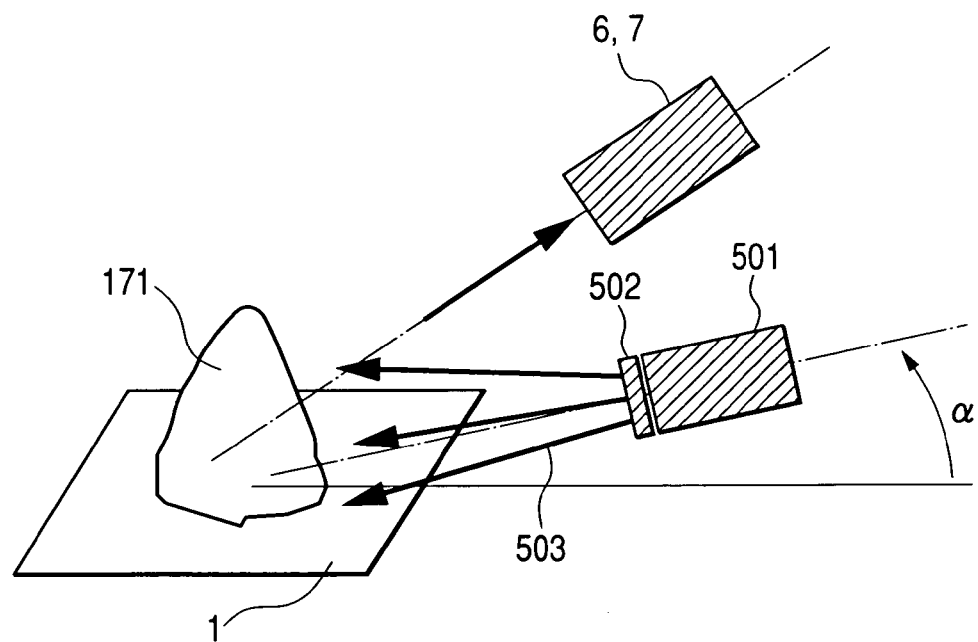
FIG. 8 is a schematic perspective view of an illumination optical system of a third embodiment different from that of the first and second embodiments.
Figure 9:
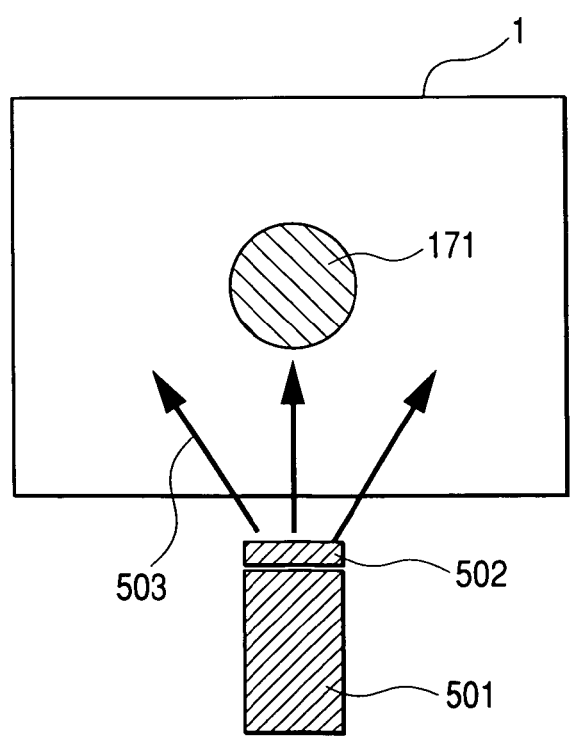
FIG. 9 is a schematic plan view of the illumination optical system according to the third embodiment shown in FIG. 8.

This state is described with reference to FIG. 7. FIG. 7 is a plan view of the illumination system in the perspective view of FIG. 6. The illumination optical systems 302 and 303 illuminate the objective bump 171 from two directions. By doing so, the whole bump is illuminated. Further, the detection lens 6 can allow only a part having the height information of the bump to appear against the background for the detection of the part. This is because the elevation angle α is lower than that of the detection optical system 6. Thus, when the bump 171 is illuminated from two directions, the edge of the bump 171 having a shape of pseudo cone can be extremely made brighter than the background. A third embodiment of the illumination optical system in the bump shape measuring apparatus according to the present invention is described with reference to FIGS. 8 and 9. The third embodiment differs from the first and second embodiments in the following points. That is, a diffusion lens 502 is mounted at the front of an illumination device or an illumination optical system 501. By doing so, the illumination light from the illumination device or the illumination optical system 501 is diffused to a horizontal direction, and the diffused light 503 is emitted not only to the front face but also to side faces of the bump 171. An elevation angle α of the illumination device or the illumination optical system 501 is lower than that of the detection lens 6, e.g., about 10°. FIG. 9 is a plan view of the illumination system shown in the perspective view of FIG. 8. The illumination device or the illumination optical system 501 and the diffusion lens 502 illuminate the bump 171 to be measured, from a direction of the detection lens 6. By doing so, the whole bump is illuminated. Further, the detection lens 6 can allow only a part having the height information of the bump to appear against the background for the detection of the part. This is because the elevation angle α is lower than that of the detection optical system 6.

Figure 10:
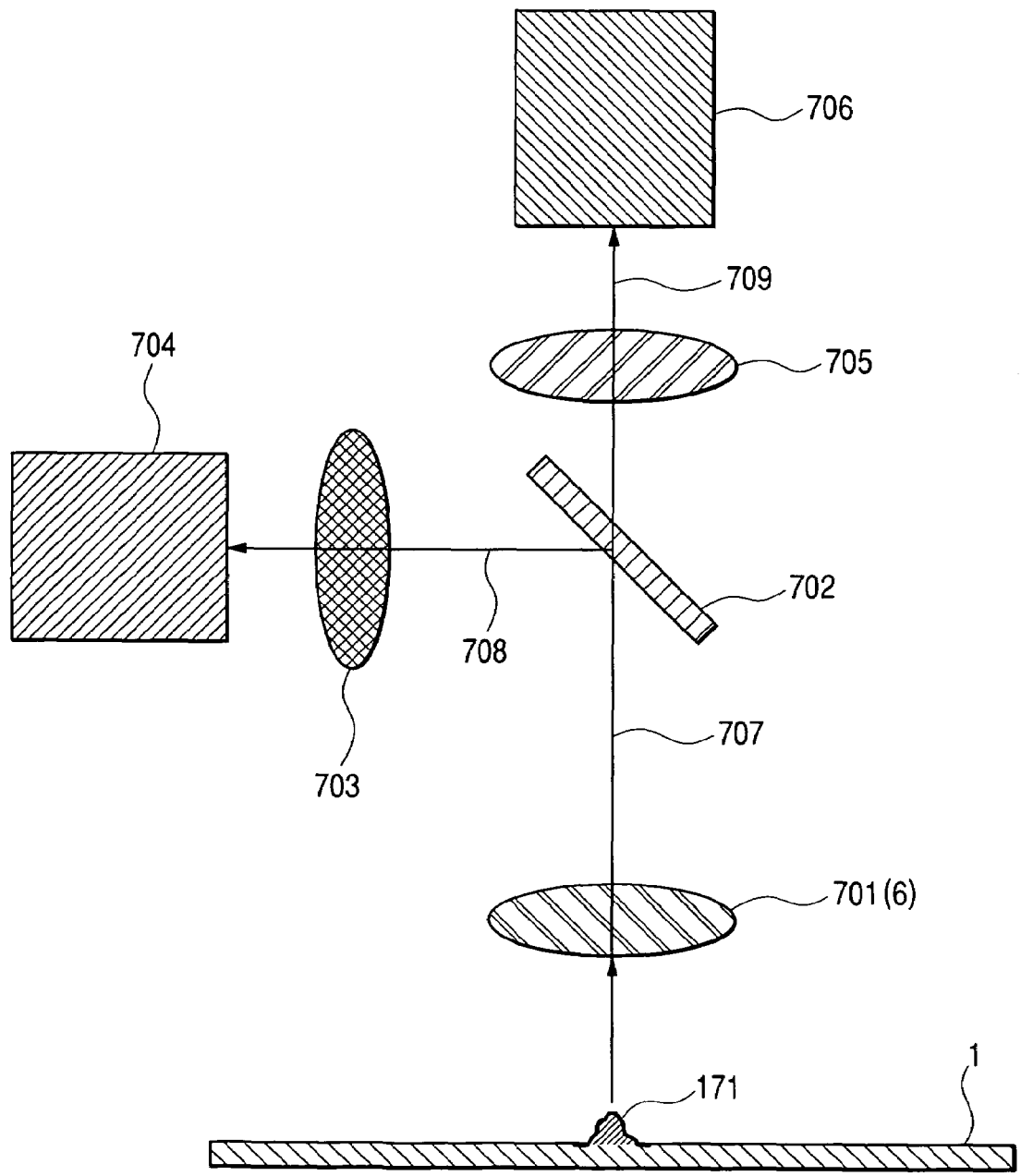
FIG. 10 is a schematic front view of a detection optical system of a second embodiment different from that of the first embodiment shown in FIG. 2.

A second embodiment of the detection optical system in the bump shape measuring apparatus according to the present invention is described by referring to FIGS. 10 and 11. The second embodiment differs from the first embodiment shown in FIG. 2 in the following points. That is, an image forming lens 703 and linear sensor camera (e.g., CCD linear image sensor) 704 focused on the tip of the bump 171, and an image forming lens 705 and linear sensor camera (e.g., CCD linear image sensor) 706 focused on the bottom (base) of the bump 171 are provided. By virtue of this construction, the linear sensor camera 704 takes a sharp image of the tip of the bump 171, and the linear sensor camera 706 takes a sharp image of the bottom of the bump 171. That is, the bump 171 as an object to be measured on the printed board 1 is illuminated at the angle α in accordance with the first to third embodiments of the illumination optical system.

A detection lens 701(6) is mounted at the same elevation angle β as in the first embodiment of the detection optical system shown in FIG. 2. Reflected light 707 from the bump, which is detected by the detection lens 701, is separated into first light 708 and second light 709 by a branched optical system 702. The first light 708 forms an image on the linear sensor camera 704 using the image forming lens 703. Similarly, the second light 709 forms an image on the linear sensor camera 706 using the image forming lens 705.

FIG. 11(*a*) shows a state where the tip of the bump 171 is rendered into a focused state by the image forming lens 703 and imaged by the linear sensor camera 704. FIG. 11(*b*) shows a state where the bottom of the bump 171 is rendered into a focused state by the image forming lens 705 and imaged by the linear sensor camera 706. A field of view 801 means one where the linear sensor camera 704 takes an image. When the bump is scanned at a detection position 805 in a detectable area 803, the linear sensor camera 704 takes an image of the tip of the bump. Accordingly, the image forming lens 703 is adjusted such that the tip of the bump is rendered into a focused state. A field of view 802 means one where the linear sensor camera 706 takes an image. When the bump is scanned at a detection position 806 in a detectable area 804, the linear sensor camera 706 takes an image of the bottom of the bump. Accordingly, the image forming lens 705 is adjusted such that the bottom of the bump is rendered into a focused state.

As described above, when the image is detected on the different focal planes, image blurring due to a shortage of a focal depth can be prevented even if accuracy in shape measurement of the bump 171 is enhanced by increasing magnification of the detection lens 701 (6). Of course, even when the height of the bump 171 is increased, the shape of the bump can be accurately detected with higher resolution because each of the tip and bottom of the bump is imaged in a focused state. As a result, the measurement accuracy of the shape of the bump can be improved.

Figure 12:
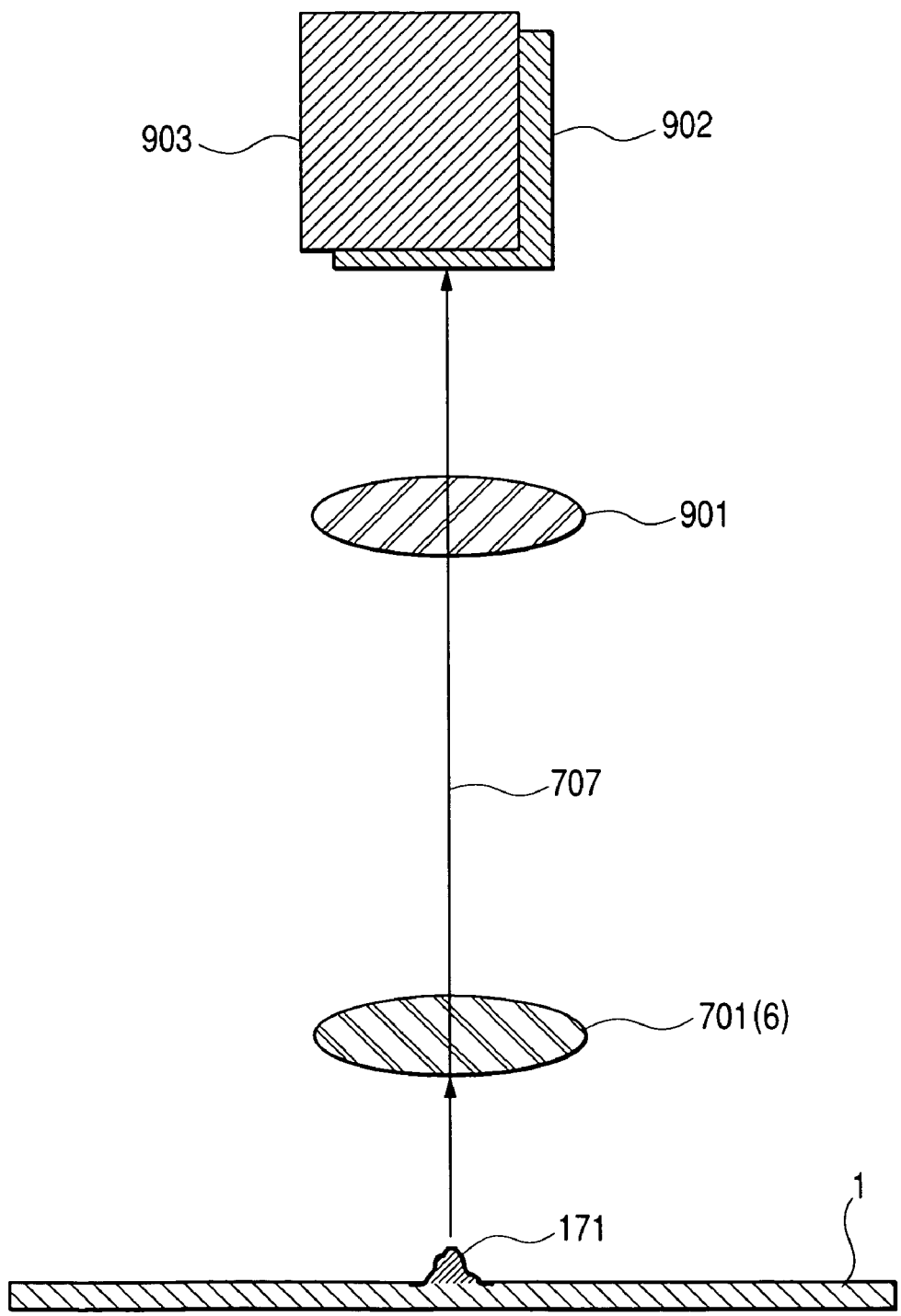
FIG. 12 is a schematic front view of a detection optical system of a third embodiment different from that of the first and second embodiments.
Figure 13:
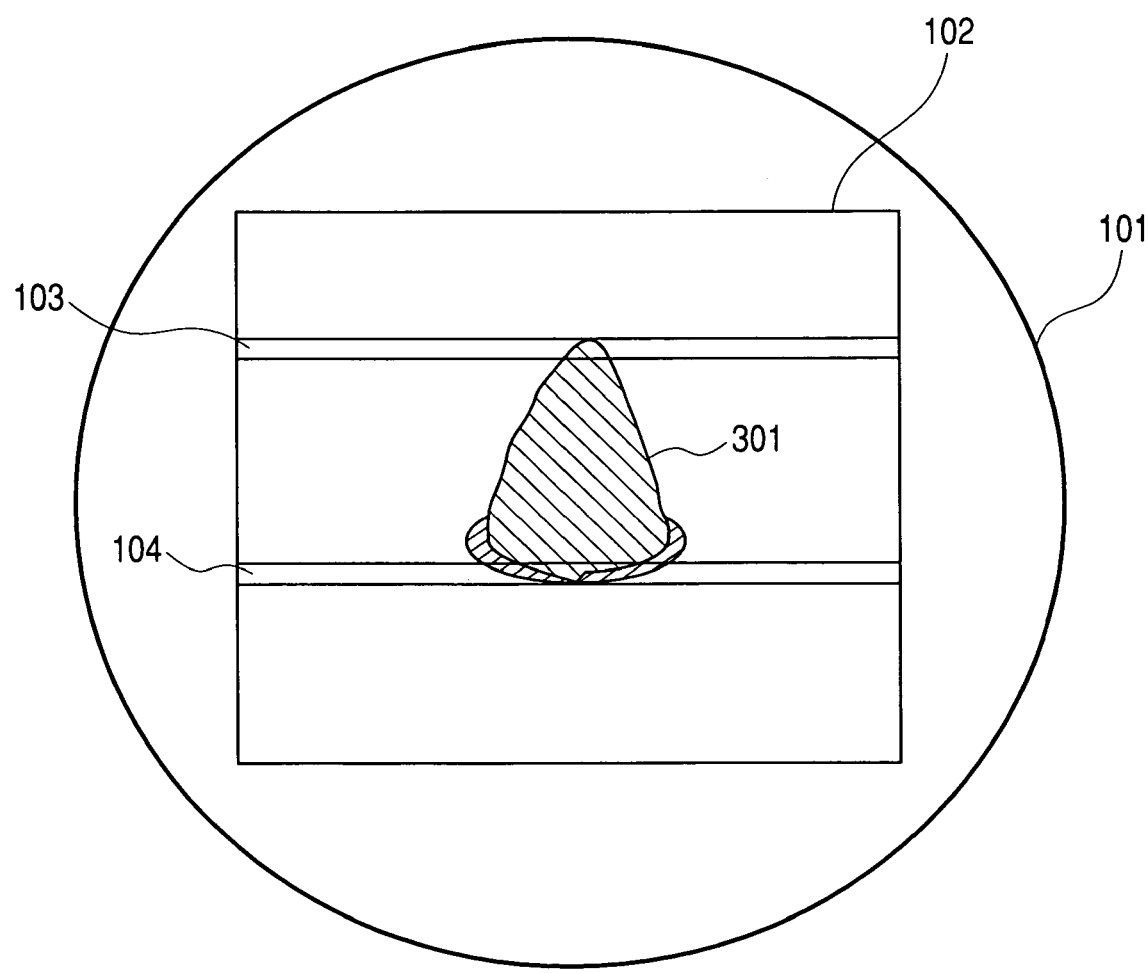
FIG. 13 is a diagram showing a state in which a first linear image sensor takes an image focusing on a tip of a bump and a second linear image sensor takes an image focusing on the base of the bump in a detection optical system shown in FIG. 12.

A third embodiment of the detection optical system in the bump shape measuring apparatus according to the present invention is described by referring to FIGS. 12 and 13. The third embodiment differs from the second embodiment in the following points. That is, the image of the tip of the bump 171, which is formed by an image forming lens 901, is taken by a linear sensor device 902. The image of the bottom (base) of the bump 171, which is formed by an image forming lens 901, is taken by a linear sensor device 903. Specifically, a light receiving surface of the linear sensor device 902 is provided such that the tip of the bump is rendered into a focused state. A light receiving surface of the linear sensor device 903 is provided such that the bottom of the bump is rendered into a focused state. FIG. 13 shows a state where each of the linear sensor devices 902 and 903 takes an image. A field of view 101 means one where each of the linear sensor devices 902 and 903 takes an image. In a detectable area 102, an image in a line 103 including the tip of the bump is acquired by the linear sensor device 902, and an image in a line 103 including the bottom of the bump is acquired by the linear sensor device 903. Since the image is detected on the different focal planes similar to the third embodiment, the same effect as in the second embodiment is obtained.

Figure 14:
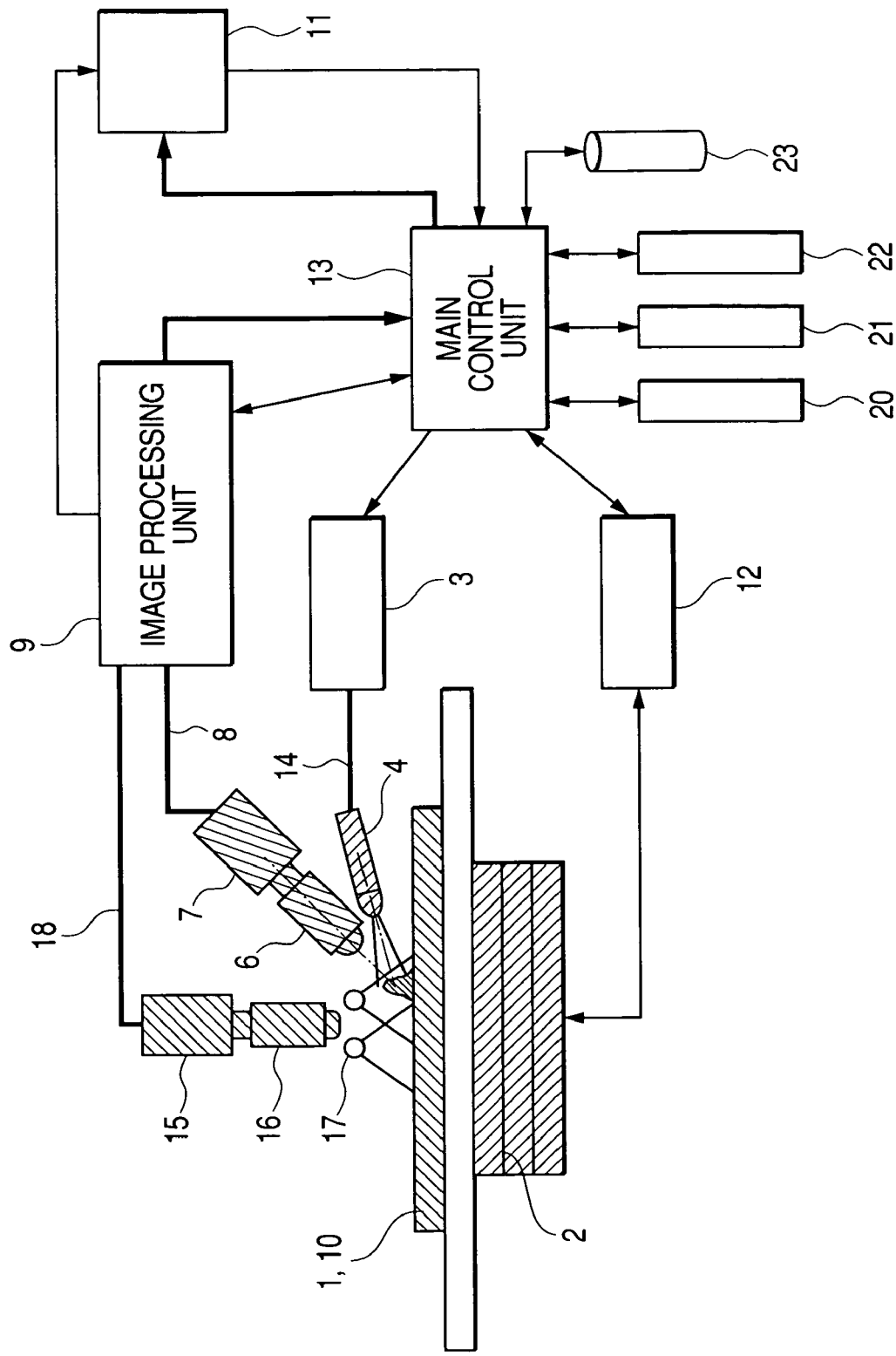
FIG. 14 is a configuration diagram illustrating a second embodiment of a bump shape measuring apparatus according to the present invention.

A second embodiment of the bump shape measuring apparatus according to the present invention is described by referring to FIGS. 14, 15 and 16. In the second embodiment, an illumination optical system and a detection optical system each capable of also testing through-holes (holes) formed on the printed board 10 are added to the first embodiment. One example of the printed board 10 to be measured includes a multilayer printed board shown in FIG. 16(*a*) manufactured by the method shown in FIG. 1, wherein using a drill or laser processing, through-holes (holes) 180 are formed in the region where bumps are not formed, as shown in FIG. 16(*b*). Another example of the printed board 10 to be measured may include a printed board where typical through-holes are formed.

More specifically, for the second embodiment, an illumination optical system 17 and a detection optical system are added in addition to the components included in the first embodiment. The illumination optical system 17 performs a ring-like illumination on the multilayer printed board 10 from above. The detection optical system is composed of a detection lens 16 and a detection camera 15. The detection lens 16 condenses reflected light from above, which is obtained from the multilayer printed board 10. The detection camera 15 receives a light image of the pattern (through-hole) 180 of the multilayer printed board 10, which is obtained from the detection lens 16. Thus, the image of the multilayer printed board 10 can also be detected from above. By taking such a construction, the following advantages can be obtained. That is, the image processing unit 9 can measure the position and shape of the bump 171 formed on the printed board 1 from the image signal 8 detected by the linear sensor cameras 7; 704 and 706; and the linear sensor devices 902 and 903. Further, the image processing unit 9 can also measure the position and shape of the through-holes (holes) 180 formed within the multilayer printed board 10 from the image signal 18 obtained by the detection camera 15.

How to use the second embodiment is described by referring to FIG. 15. The position and shape of the bump 171 of the printed board 1 having bumps to be measured mounted thereon are measured by the image processing unit 9 and the main control unit 13, based on the image signal 8 detected by the linear sensor cameras 7; 704 and 706; and the linear sensor devices 902 and 903. Further, the position and shape of the through-hole 180 of the multilayer printed board 10 having holes formed thereon are measured by the image processing unit 9 and the main control unit 13, based on the image signal 18 obtained by the detection camera 15. The detection camera 15 detects the position and shape of the through-hole 180 in the form of an image signal composed of a dark section indicating a circular hole part and a bright section indicating a circumference thereof. The main image processing unit 94 projects, for example, an image signal in the region near the hole (it may be cut out for each through-hole), which is A/D converted and stored in the image memory 92, in X and Y axis directions (the image element is integrated). Using a distance between both of the edges in the Y axis direction, a diameter in the Y axis direction and a central position thereof are each determined, whereby a positional coordinate in the Y axis direction can be determined. Using a distance between both of the edges in the X axis direction, a diameter in the X axis direction and a central position thereof are each determined, whereby a positional coordinate in the X axis direction can be determined.

The main control unit 13 compares both of the position information each other based on the reference mark position measured using measuring means (not shown) and stored in the storage unit 23. Thus, a correlation between the bump position 156 on the printed board 1 having bumps mounted thereon, which is the measurements 155, and the hole position 158 on the multilayer printed board 10 having holes formed thereon, which is the measurements 157, is obtained.

As a result, the amount of the deviation in position between bumps and holes on the multilayer printed board 10 can be readily known. It should be noted that the reference marks are formed on both of the printed board 1 and the multilayer printed board 10.

Figures 16A, 16B, 16C:
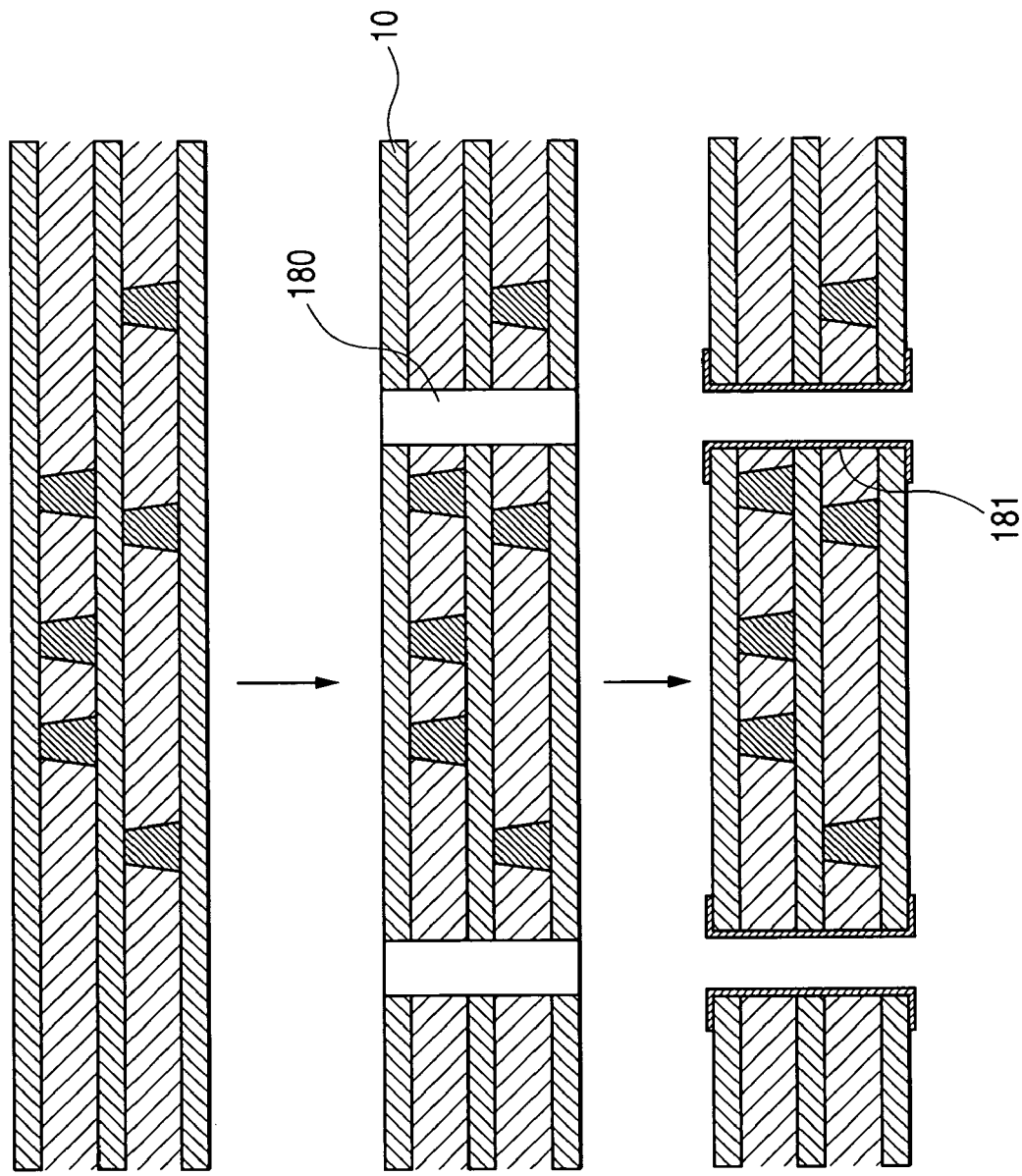
FIGS. 16(a), 16(b) and 16(c) are diagrams for explaining a manufacturing process of a multilayer printed board to be measured by a bump shape measuring apparatus shown in FIG. 14.

Thereafter, a through-hole conductor 181 is formed in the through-hole 180 of the multilayer printed board 10 measured by plating as shown in FIG. 16(c). Accordingly, in the case where the conductors (the bump 171 or the through-hole conductor 181) are arranged with a high density, a short circuit or a state near the short circuit can be eliminated, for example, by confirming a distance between the through-hole conductor and the bump nearest to the through-hole conductor.

As described above, according to the present embodiment, a geometrical distribution of the bumps can also be simply measured in a short time for use in a method or line for manufacturing bumps on the printed board. Therefore, an apparatus management and process management in the bump manufacturing step can be stably performed, for example, by performing the measurement after formation of bumps and by feeding the height distribution and position deviation of bumps back to the bump manufacturing apparatus one after another. Further, optimization of the design change of the bump shape can be performed by comparing the bump measured data with the design data so as to be useful for accuracy improvement in the manufacturing and the simulation.

Further, according to the present embodiment, when the multilayer printed board is manufactured by a connection method using bumps, the multilayer printed board having high reliability can be manufactured with high yield. Moreover, the throughput can be improved, leading to the throughput improvement in the whole step.

It should be noted that although a bump mounted on the printed board has been described, a bump mounted on a semiconductor wafer or a semiconductor chip, or a bump having a ball shape is included.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An apparatus for measuring a shape of bumps, comprising:
    a stage on which a board arranged thereon with a plurality of bumps to be measured is placed and moved;
    an illumination optical system which illuminates the bumps arranged on said board moved by said stage with illumination light using an illumination optical axis having a low tilt angle to a surface of said board;
    a detection optical system which condenses the reflected light from the bumps illuminated by said illumination optical system for detection of image signals of the bumps using a detection optical axis having a tilt angle higher than that of said illumination optical axis to the surface of said board;
    an image processing unit which A/D converts the image signals of the bumps detected by said detection optical system to obtain digital image signals of the bumps, calculates an outline of at least a tip and a base of each of the bumps based on the image signals of at least the tip and the base of each of the bumps obtained based on the digital image signals of the bumps, and calculates geometric characteristics including at least a position and a height of each of the bumps are calculated based on the outline of at least the tip and the base of each of the bumps; and
    a main control unit which allows a display unit to display thereon information on the geometric characteristics of each of the bumps calculated by said image processing unit.

2. The apparatus according to claim 1, wherein the geometric characteristics of each of the bumps calculated in said image processing unit further includes a base diameter of each of the bumps.

3. The apparatus according to claim 1, wherein in said image processing unit, quality of each of the bumps is determined based on the further calculated geometric characteristics of the bumps and said determination results are provided to said main control unit.

4. The apparatus according to claim 1, wherein said detection optical system has a condenser lens for condensing reflected light from each bump and a linear image sensor for receiving the reflected light from each bump condensed by said condenser lens and converting the reflected light into an image signal.

5. The apparatus according to claim 1, wherein said illumination optical system is configured such that each of said bumps is illuminated with said illumination light from a plurality of directions.

6. The apparatus according to claim 1, wherein said illumination optical system emits diffused illumination light as said illumination light.

7. An apparatus for measuring a shape of bumps, comprising:
    a stage on which a board arranged thereon with a plurality of bumps to be measured is placed and moved;
    an illumination optical system which illuminates the bumps arranged on said board moved by said stage with illumination light using an illumination optical axis having a low tilt angle to a surface of said board;
    a detection optical system which condenses the reflected light from the bumps illuminated by said illumination optical system for detection of image signals of the bumps using a detection optical axis having a tilt angle higher than that of said illumination optical axis to the surface of said board;
    an image processing unit which A/D converts the image signals of the bumps detected by said detection optical system to obtain digital image signals of the bumps, calculates an outline of at least a tip and a base of each of the bumps based on the image signals of at least the tip and base of each of the bumps obtained based on the digital image signals of the bumps, calculates geometric characteristics including at least a position and a height of each of the bumps are calculated based on the outline of at least the tip and the base of each of the bumps, and determines quality of each of the bumps based on the calculated geometric characteristics of the bumps; and
    a main control unit which outputs information on the quality of each of the bumps determined by said image processing unit.

8. The apparatus according to claim 7, wherein the geometric characteristics of the bumps calculated in said image processing unit further includes a base diameter of each of the bumps.

9. The apparatus according to claim 7, wherein said main control unit is configured such that information on the geometric characteristics of the bumps calculated by said image processing unit is displayed on a display unit.

10. The apparatus according to claim 7, wherein in said main control unit, the information on the geometric characteristics of each of the bumps displayed on said display unit includes at least one of distribution in the geometric characteristics of the bumps on the board, occurrence frequency of the bumps with respect to the geometric characteristics, and variation with time in the geometric characteristics of the bumps.

11. The apparatus according to claim 7, further comprising an image data preservation unit for preserving the A/D converted image signals, which are obtained from said image processing unit, of at least the bump determined to be defective.

12. The apparatus according to claim 7, wherein in said illumination optical system, said illumination light is white light or light having a wavelength of 570 nm or less.

13. The apparatus according to claim 7, wherein said detection optical system includes a condenser lens for condensing reflected light of each bump, and a linear image sensor for receiving the reflected light, of each bump, condensed by said condenser lens and for converting the reflected light into image signals.

14. The apparatus according to claim 13, wherein said linear image sensor includes a first linear image sensor for receiving light focusing on a tip of each bump and a second linear image sensor for receiving light focusing on a base of each bump.

15. The apparatus according to claim 13, wherein said illumination optical system is configured such that light is emitted to each bump in a strip-like or slit-like shape corresponding to a light-receiving region of said linear image sensor.

16. The apparatus according to claim 7, wherein said illumination optical system is configured such that each of said bumps is illuminated with said illumination light from a plurality of directions.

17. The apparatus according to claim 7, wherein said illumination optical system emits diffused illumination light as said illumination light.

18. A method for measuring a shape of bumps, comprising the steps of:

illuminating bumps arranged on a board from a first direction having a lower angle with respect to a surface of said board;

detecting reflected light from said bumps illuminated from said first angle direction in a second direction having an angle higher than that in said first direction with respect to the surface of said board so as to obtain image signals of said bumps;

processing the detected image signals of said bumps to calculate geometric characteristics including information on at least a position and a height of each of said bumps; and wherein the geometric characteristics including at least the position and the height of each of said bumps are calculated by calculating an outline of at least the tip and the base of each of the bumps based on the image signal of at least the tip and the base of each of said bumps among the detected image signals of said bumps, and calculating geometric characteristics including at least the position and the height of each of said bumps based on the calculated outline of at least the tip and the base of each of said bumps;

displaying the information on the calculated geometric characteristics of said bumps on a screen.

19. The method according to claim 18, wherein the step of illuminating said board from the first angle direction and the step of detecting said reflected light in the second angle direction to obtain the image signals are performed while said board are continuously moved at least in one direction.

20. The method according to claim 18, wherein the step of displaying information on said screen displays on said screen information on the distribution of the height, bottom diameter and bottom position of each of said bumps on said board as the information on the geometrical characteristics of said bumps.

21. The method according to claim 18, wherein the step of displaying information on said screen displays on said screen information on each defect of the height, bottom diameter and bottom position of each of said bumps on said board as the information on the geometrical characteristics of said bumps.

* * * * *